United States Patent
Sawada et al.

(10) Patent No.: US 11,825,616 B2
(45) Date of Patent: Nov. 21, 2023

(54) VEHICLE-MOUNTED ELECTRONIC APPARATUS

(71) Applicant: Mitsubishi Electric Corporation, Tokyo (JP)

(72) Inventors: Shunsuke Sawada, Tokyo (JP); Masakazu Shoji, Tokyo (JP); Takahiro Mukado, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 300 days.

(21) Appl. No.: 17/432,600

(22) PCT Filed: Apr. 3, 2019

(86) PCT No.: PCT/JP2019/014823
§ 371 (c)(1),
(2) Date: Aug. 20, 2021

(87) PCT Pub. No.: WO2020/202503
PCT Pub. Date: Oct. 8, 2020

(65) Prior Publication Data
US 2022/0071031 A1    Mar. 3, 2022

(51) Int. Cl.
*H05K 5/02* (2006.01)
*F16B 5/02* (2006.01)
*H05K 5/04* (2006.01)

(52) U.S. Cl.
CPC ............. *H05K 5/0217* (2013.01); *F16B 5/02* (2013.01); *H05K 5/04* (2013.01)

(58) Field of Classification Search
CPC ............ H05K 5/0217; H05K 5/04; F16B 5/02

USPC ........................................................ 361/807
See application file for complete search history.

(56) References Cited

U.S. PATENT DOCUMENTS

2016/0073517 A1*  3/2016  Mukado ............... H05K 5/0008
                                                                 361/752

FOREIGN PATENT DOCUMENTS

| JP | 6-9172 U | 2/1994 |
| JP | 2002-185164 A | 6/2002 |
| JP | 2008-14361 A | 1/2008 |
| JP | 2014-203956 A | 10/2014 |
| WO | WO 2015/022730 A1 | 2/2015 |

OTHER PUBLICATIONS

Japanese Office Action issued in the corresponding Japanese Patent Application No. 2021-511855 dated Apr. 28, 2022 with an English Translation.

(Continued)

*Primary Examiner* — Binh B Tran
(74) *Attorney, Agent, or Firm* — Birch, Stewart, Kolasch & Birch, LLP

(57) ABSTRACT

A drawn portion having a shape protruding from a side face to a space inside a housing is provided at an end to which a rear surface cover is fastened of the side face. On a side to which the rear surface cover is fastened of the drawn portion, a bent portion having a shape bent toward a space outside the housing is provided. A screw receiving portion including a screw hole includes a first receiving surface, which is a flat surface portion on an end of the bent portion, and a second receiving surface having a shape protruding from a base of the bent portion.

2 Claims, 6 Drawing Sheets

(56) References Cited

OTHER PUBLICATIONS

Japanese Office Action issued in the corresponding Japanese Patent Application No. 2021-511855 dated Jan. 20, 2022 with an English Translation.
International Search Report (PCT/ISA/210) issued in PCT/JP2019/014823, dated Jun. 18, 2019.
Office Action dated Aug. 23, 2022 in corresponding Japanese Patent Application No. 2021-511855 with an English Translation.

* cited by examiner

VEHICLE-MOUNTED ELECTRONIC APPARATUS

TECHNICAL FIELD

The present invention relates to a vehicle-mounted electronic apparatus.

BACKGROUND ART

In a case where a member to be fastened is fastened to a metal housing using a screw, it is necessary to prevent a metal foreign matter generated at the time of screw fastening from entering the metal housing. In some vehicle-mounted electronic apparatuses, an installation space on a vehicle is determined in advance, as exemplified by a vehicle navigation device that fits into a dashboard. The metal housing of such vehicle-mounted electronic apparatus needs to be designed in such a manner as to fit into the installation space, and thus such vehicle-mounted electronic apparatus cannot have a screw fastening structure in a position protruding from the metal housing. Therefore, for example, Patent Literature 1 proposes a screw fastening structure in which a drawn fastening portion having a lower surface and an upper surface integral with each other is provided on a bottom surface of a metal housing. This drawn fastening portion includes an outer edge that extends from the upper surface and that is bent outward in such a manner as to be opposed to a fastened member. On the outer edge, a screw hole is formed in a position which corresponds to the outer side of the metal housing and which is lower than the upper surface. Since a tip of a screw that fastens the fastened member to the outer edge protrudes outside the metal housing, a metal foreign matter generated at the time of screw fastening does not enter the metal housing.

CITATION LIST

Patent Literature

Patent Literature 1: JP 2014-203956 A

SUMMARY OF INVENTION

Technical Problem

In the screw fastening structure disclosed in Patent Literature 1, the outer edge serves as a seating surface of the screw. In order for the outer edge to serve as the seating surface of the screw, the outer edge needs to have a larger area than that of the screw head. In order to increase the area of the outer edge, it is necessary to increase a drawing depth of the drawn fastening portion. However, when the drawing depth is increased, the inner space of the metal housing is narrowed accordingly. As described above, there has been a problem that the inner space of the metal housing is narrowed when the drawing depth is increased in the vehicle-mounted electronic apparatus which cannot have a screw fastening structure in a position protruding from the metal housing.

The present invention is achieved in order to solve the above-described problem, and an object thereof is to suppress the narrowing of the inner space of a metal housing in a vehicle-mounted electronic apparatus which cannot have a screw fastening structure in a position protruding from the metal housing.

Solution to Problem

A vehicle-mounted electronic apparatus according to the present invention is a vehicle-mounted electronic apparatus provided with a screw fastening structure which fastens, to a first face of a metal housing, a second face, in which the screw fastening structure is provided with a drawn portion having a shape protruded from the first face to an inside of the metal housing, the drawn portion provided at an end of the first face, the second face fastened to the end of the first face, a bent portion having a shape bent toward a space outside the metal housing, the bent portion provided on a side of the drawn portion, the second face fastened to the side of the drawn portion, and a screw receiving portion including a screw hole, the screw receiving portion formed of a first receiving surface, which is a flat surface portion on an end of the bent portion and is perpendicular to the first face, and a second receiving surface having a shape protruded from a base of the bent portion, the second receiving surface perpendicular to the first face.

Advantageous Effects of Invention

According to the present invention, it is possible to suppress the narrowing of the inner space of a metal housing in a vehicle-mounted electronic apparatus which cannot have a screw fastening structure in a position protruding from the metal housing.

DESCRIPTION OF EMBODIMENTS

Modes for carrying out the present invention are hereinafter described with reference to the attached drawings in order to describe the present invention in more detail.

First Embodiment

Figure 1:
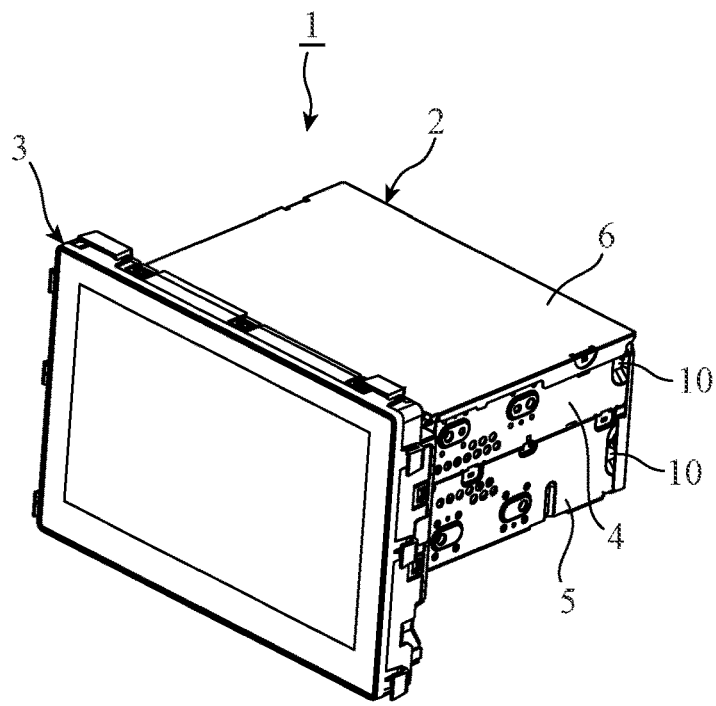
FIG. 1 is a front perspective view illustrating a configuration example of a vehicle-mounted electronic apparatus according to a first embodiment.
Figure 2:
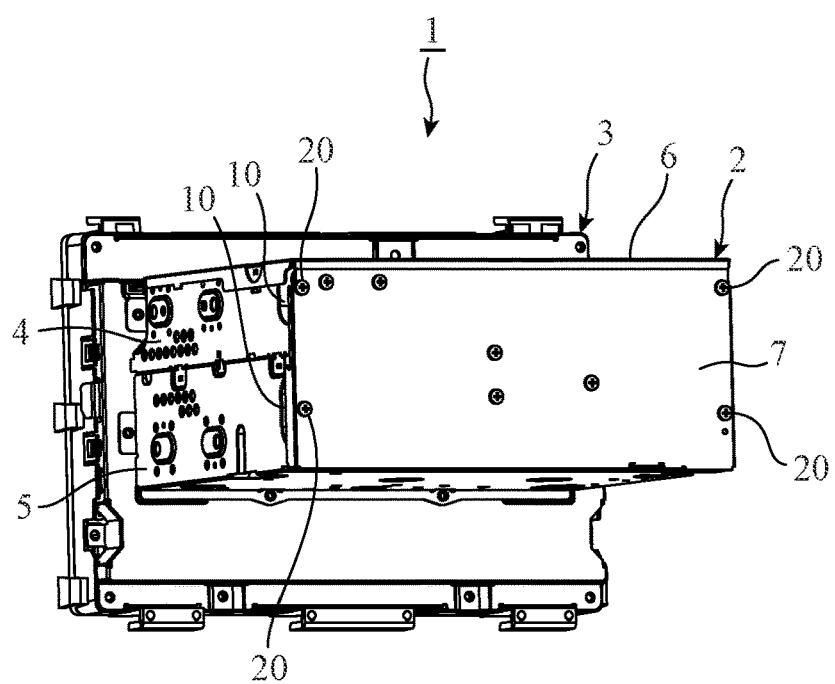
FIG. 2 is a rear perspective view illustrating the configuration example of the vehicle-mounted electronic apparatus according to the first embodiment.

FIG. 1 is a front perspective view illustrating a configuration example of a vehicle-mounted electronic apparatus 1 according to a first embodiment. FIG. 2 is a rear perspective view illustrating the configuration example of the vehicle-mounted electronic apparatus 1 according to the first embodiment. The vehicle-mounted electronic apparatus 1 is provided with a metal housing 2 and a monitor unit 3, the metal housing 2 and the monitor unit 3 being integrally formed. The vehicle-mounted electronic apparatus 1 is, for example, a vehicle navigation device, and the metal housing 2 is to be fitted into an installation space formed on the dashboard of a vehicle. Therefore, the vehicle-mounted electronic apparatus 1 cannot have a screw fastening structure 10 in a position protruding from the metal housing 2.

In the illustrated example, the metal housing 2 is formed by vertically stacking a first housing 4 and a second housing 5. The first housing 4, which is a sheet-metal member, includes two opposed side faces and one bottom face connecting these two side faces. Similarly, the second housing 5, which is a sheet-metal member, includes two opposed side faces and one bottom face connecting these two side faces. An upper surface of the first housing 4 is covered with an upper surface cover 6, which is a sheet-metal member. An upper surface of the second housing 5 is covered with the bottom face of the first housing 4. Rear surfaces of the first housing 4 and the second housing 5 are covered with a rear surface cover 7, which is a sheet-metal member, and front surfaces thereof are covered with the monitor unit 3.

Note that, the metal housing 2 can be formed of a plurality of housings as in the illustrated example, or can be formed of one housing.

Next, the screw fastening structure 10 is described.

Figure 3:
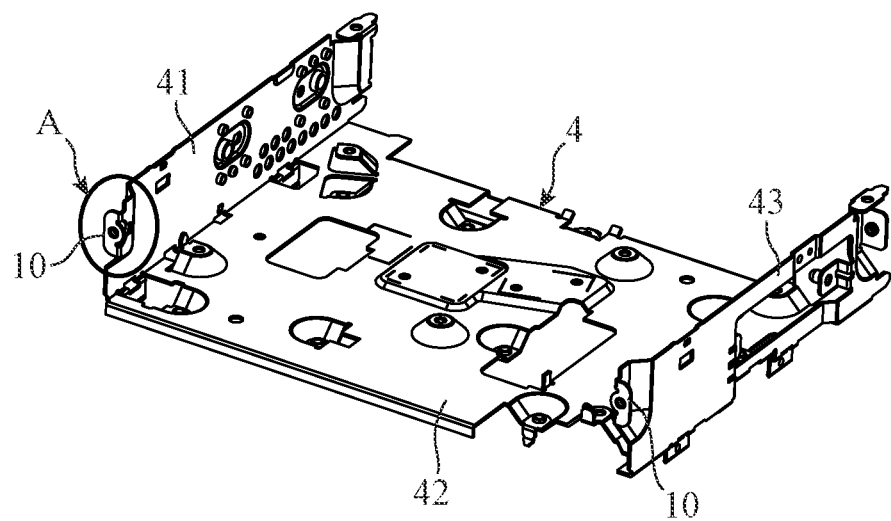
FIG. 3 is a rear perspective view illustrating a configuration example of a first housing.
Figure 4:
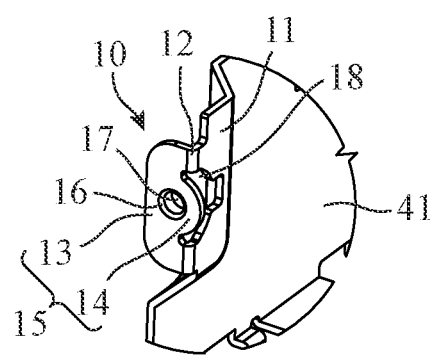
FIG. 4 is an enlarged view of a portion enclosed by frame A in FIG. 3.

FIG. 3 is a rear perspective view illustrating a configuration example of the first housing 4. FIG. 4 is an enlarged view of a portion enclosed by frame A in FIG. 3. Herein, it is assumed that the first housing 4 is formed of two opposed side faces 41 and 43 and a bottom face 42. The side faces 41 and 43 each correspond to a "first face" forming the metal housing 2, and the rear surface cover 7 corresponds to a "second face". The screw fastening structure 10 is a structure for fastening the rear surface cover 7 to the first housing 4.

The rear surface cover 7 is fastened to the first housing 4 by two screw fastening structures 10. One of the two screw fastening structures 10 is provided at an end to which the rear surface cover 7 is fastened of the side face 41, and the other is provided at an end to which the rear surface cover 7 is fastened of the side face 43. Hereinafter, the screw fastening structure 10 on the side face 41 is representatively described.

As illustrated in FIG. 4, a drawn portion 11 is provided at the end to which the rear surface cover 7 is fastened of the side face 41. The drawn portion 11 has a shape protruding from the side face 41 to the inside of the first housing 4. The drawn portion 11 is formed by, for example, a drawing process. The space on the concave side of the drawn portion 11, that is, on the outside of the first housing 4, is a space in which the tip of a screw 20 (refer to FIG. 2) is disposed.

On a side to which the rear surface cover 7 is fastened of the drawn portion 11, a bent portion 12 having a shape bent toward a space outside the first housing 4 is provided. A flat surface portion on a bent end of the bent portion 12 serves as a first receiving surface 13 perpendicular to the side face 41. The first receiving surface 13 is a surface parallel to the rear surface cover 7, and the first receiving surface 13 is a surface opposed to the rear surface cover 7.

On the base of the bent portion 12, that is, on a drawn portion 11 side thereof, a second receiving surface 14 is provided which has a shape protruding from the base in a direction opposite to the first receiving surface 13 and which is perpendicular to the side face 41. After an arc-shaped hole 18 is formed by a punching process and the like in a portion in which the bent portion 12 is to be formed and which is included in the end of the drawn portion 11, both ends of the hole 18 are subjected to a bending process with the inner side of the hole 18 left, and thereby the bent portion 12 and the second receiving surface 14 are formed. The second receiving surface 14 is a parallel surface continuous from the first receiving surface 13. Like the first receiving surface 13, the second receiving surface 14 is a surface parallel to the rear surface cover 7, and the second receiving surface 14 is a surface opposed to the rear surface cover 7.

A screw receiving portion 15 is formed of the first receiving surface 13 and the second receiving surface 14. The screw receiving portion 15 is provided with a screw hole 16. In a case where the screw receiving portion 15 is thinner than a length of the screw 20, the screw receiving portion 15 may be provided with a burring tap 17 and the like.

Figure 5A:
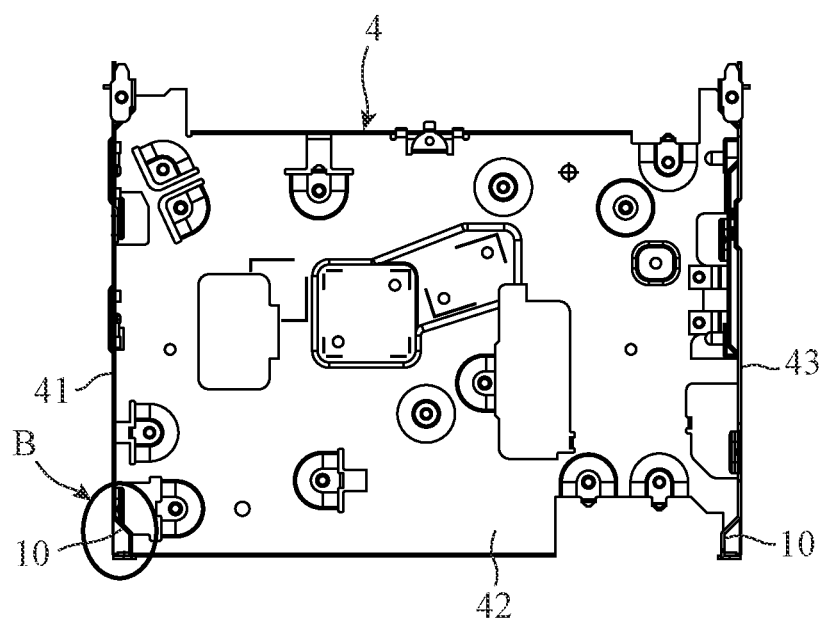
FIG. 5A is a top view illustrating the configuration example of the first housing.
Figure 5B:
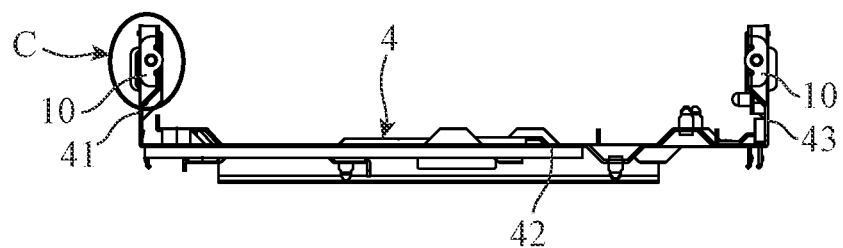
FIG. 5B is a rear view of the same.
Figure 6A:
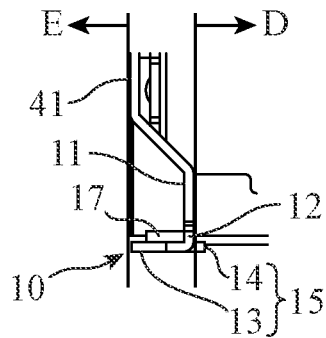
FIG. 6A is an enlarged view of a portion enclosed by frame B in FIG. 5A.
Figure 6B:
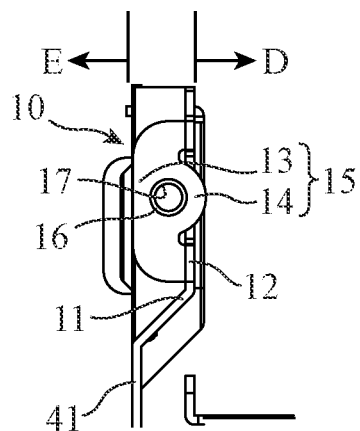
FIG. 6B is an enlarged view of a portion enclosed by frame C in FIG. 5B.

FIG. 5A is a top view illustrating the configuration example of the first housing 4, and FIG. 5B is a rear view of the same. FIG. 6A is an enlarged view of a portion enclosed by frame B in FIG. 5A, and FIG. 6B is an enlarged view of a portion enclosed by frame C in FIG. 5B. As illustrated in FIGS. 6A and 6B, the convex side of the drawn portion 11 faces a space D inside the housing, and the concave side of the drawn portion 11 faces a space E outside the housing.

Figure 7:
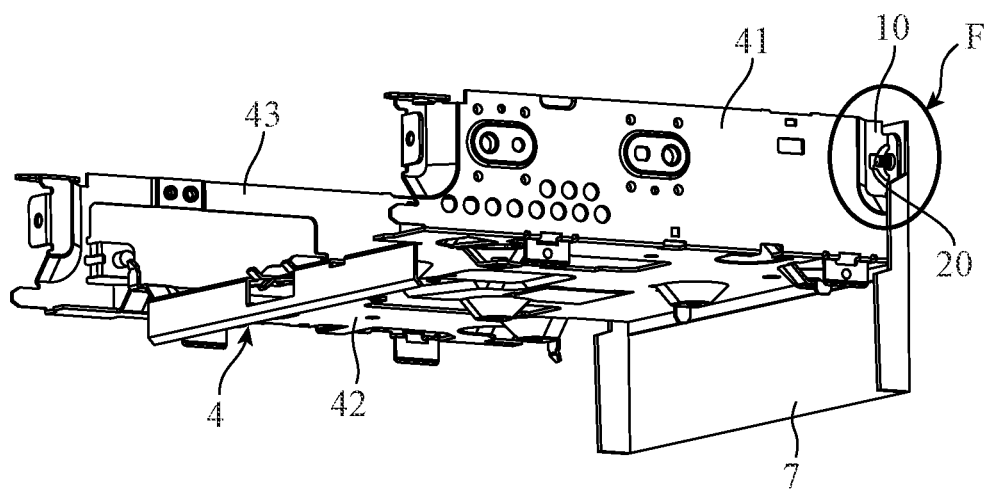
FIG. 7 is a front perspective view illustrating a fastening example of a rear surface cover to the first housing.
Figure 8:
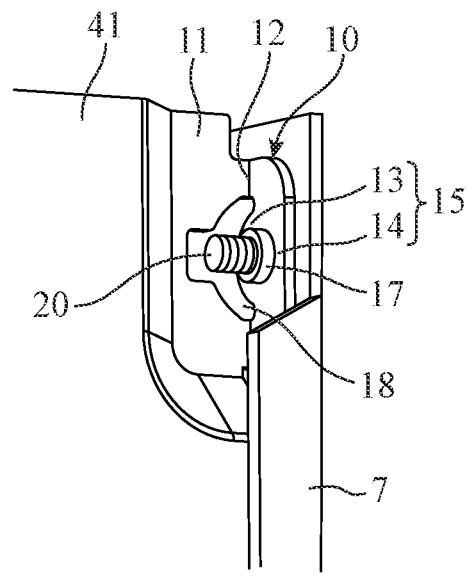
FIG. 8 is an enlarged view of a portion enclosed by frame F in FIG. 7.

FIG. 7 is a front perspective view illustrating a fastening example of the rear surface cover 7 to the first housing 4. FIG. 8 is an enlarged view of a portion enclosed by frame F in FIG. 7. As illustrated in FIG. 8, in a state in which the rear surface cover 7 abuts the screw receiving portion 15, the screw 20 is fastened to the screw hole 16 through a through hole (not illustrated) formed in the rear surface cover 7. For example, the screw 20 is fastened with the rear surface cover 7 side of the first housing 4 facing upward and the monitor unit 3 side thereof facing downward. At that time, since the screw 20 is screwed in a direction parallel to the side face 41 in the space E outside the housing (refer to FIGS. 6A and 6B) as viewed from the drawn portion 11, a metal foreign matter generated at the time of fastening drops without entering the first housing 4.

In order for the screw receiving portion 15 to serve as a seating surface of the screw 20, the screw receiving portion 15 needs to have a certain area (for example, an area larger than the head of the screw 20). In a case where there is no second receiving surface 14, the screw receiving portion 15 is formed only of the first receiving surface 13, so that, in such a case, the area of the first receiving surface 13 needs to be made larger than the area of the first receiving surface 13 illustrated in FIG. 6B and the like.

As an example of a means for increasing the area of the first receiving surface 13, there is a means for lengthening the first receiving surface 13, which is a flat surface portion on the end of the bent portion 12. However, when the first receiving surface 13 is lengthened, an end of the first receiving surface 13 protrudes into the space E outside the housing. As described above, since the installation space on the vehicle for the vehicle-mounted electronic apparatus 1 is determined in advance, it is not preferable that the end of the first receiving surface 13 protrudes into the space E outside the housing.

As another example of the means for increasing the area of the first receiving surface 13, there is a means for increasing a drawing depth of the drawn portion 11. In this case, a position of the convex side of the drawn portion 11 further enters the space D inside the housing than a position of the convex side illustrated in FIGS. 6A and 6B. Therefore, the area of the first receiving surface 13 can be increased; however, on the other hand, the inner space of the first housing 4 is narrowed.

In the first embodiment, since the second receiving surface 14 is provided by utilizing the arc-shaped hole 18, a sufficient area of the screw receiving portion 15 serving as the seating surface of the screw 20 is ensured. Therefore, the area of the first receiving surface 13, which is the flat surface portion on the end of the bent portion 12, can be minimized. As a result, the end of the first receiving surface 13 does not protrude into the space E outside the housing. In addition, since it is not necessary to increase the drawing depth of the drawn portion 11, the inner space of the first housing 4 is not narrowed.

As described above, the vehicle-mounted electronic apparatus 1 according to the first embodiment is provided with the screw fastening structure 10 that fastens the rear surface cover 7 to the side face 41 of the first housing 4. The screw fastening structure 10 is provided with the drawn portion 11, the bent portion 12, and the screw receiving portion 15. The drawn portion 11 is provided at the end to which the rear surface cover 7 is fastened of the side face 41, and has a shape protruded from the side face 41 to the space D inside the housing. The bent portion 12 is provided on the side to which the rear surface cover 7 is fastened of the drawn portion 11, and has a shape bent toward the space E outside the housing. The screw receiving portion 15 includes the first receiving surface 13, which is the flat surface portion on the end of the bent portion 12 and is perpendicular to the side face 41, and the second receiving surface 14 having a shape protruded from the base of the bent portion 12, the second receiving surface 14 perpendicular to the side face 41. The screw receiving portion 15 is also provided with the screw hole 16 for fastening the screw 20. By the presence of the second receiving surface 14, it is possible to increase the area of the screw receiving portion 15 that serves as the seating surface of the screw 20 without protruding the end of the first receiving surface 13 into the space E outside the housing, and without increasing the drawing depth of the drawn portion 11. As a result, it is possible to suppress the narrowing of the inner space of the first housing 4 in the vehicle-mounted electronic apparatus 1 which cannot have the screw fastening structure 10 in a position protruding from the metal housing 2.

Note that, in the first embodiment, the example in which the screw fastening structure 10 is used for fastening the rear surface cover 7 to the first housing 4 is described, but it is not limited thereto, and the screw fastening structure 10 can be used for fastening the upper surface cover 6 to the first housing 4, fastening the rear surface cover 7 to the second housing 5 or the like.

Second Embodiment

Figure 9:
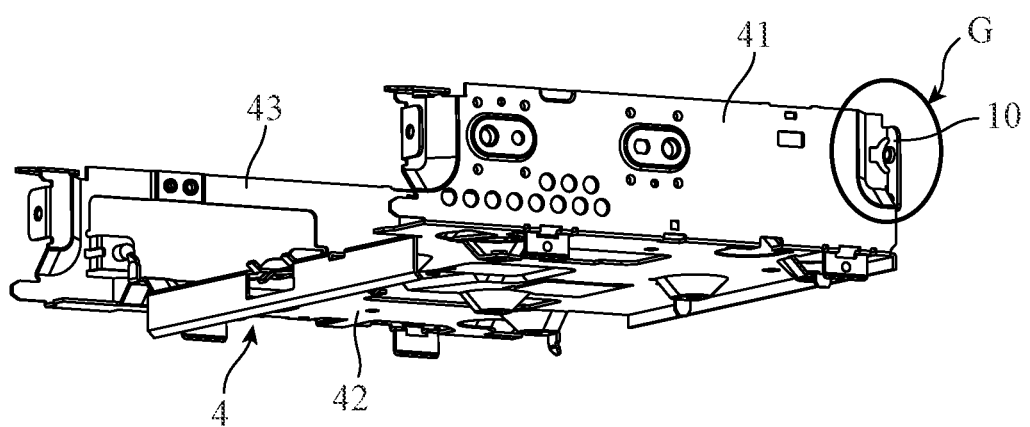
FIG. 9 is a front perspective view illustrating a configuration example of a first housing of a vehicle-mounted electronic apparatus according to a second embodiment.
Figure 10:
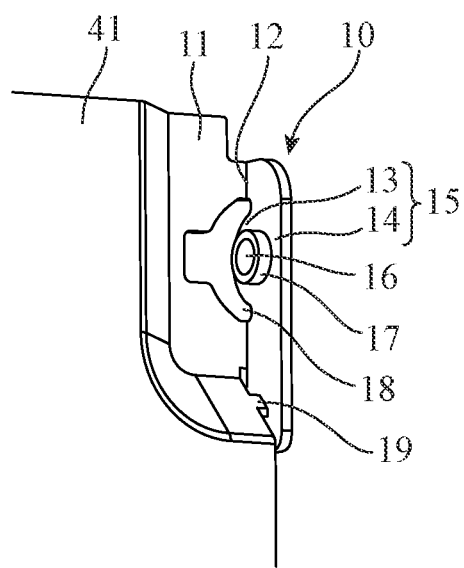
FIG. 10 is an enlarged view of a portion enclosed by frame Gin FIG. 9.

FIG. 9 is a front perspective view illustrating a configuration example of a first housing 4 of a vehicle-mounted electronic apparatus 1 according to a second embodiment. FIG. 10 is an enlarged view of a portion enclosed by frame G in FIG. 9. In FIGS. 9 and 10, components which are the same as or corresponding to those in FIGS. 1 to 8 are assigned with the same reference numerals, and the description thereof is not repeated.

A screw fastening structure 10 of the second embodiment is provided with a protrusion 19 that abuts a screw receiving portion 15 and that is provided on a portion of a drawn portion 11, the portion of the drawn portion 11 being opposed to the screw receiving portion 15. In a case where an excessive load is applied to the screw receiving portion 15 when a screw 20 (refer to FIG. 8) is fastened to a screw hole 16, the screw receiving portion 15 may be deformed. In the second embodiment, by allowing the protrusion 19 provided on the drawn portion 11 to abut the screw receiving portion 15, the protrusion 19 can serve as a stopper to achieve strength of the screw receiving portion 15 even when the load is applied to the screw receiving portion 15 at the time of screw fastening.

Note that, in the present invention, embodiments may be freely combined, any component of each embodiment may be modified, or any component of each embodiment may be omitted without departing from the scope of the invention.

INDUSTRIAL APPLICABILITY

A vehicle-mounted electronic apparatus according to the present invention is suitable for use in a vehicle-mounted electronic apparatus such as a vehicle navigation device which cannot have a screw fastening structure in a position protruding from a metal housing.

REFERENCE SIGNS LIST

1: vehicle-mounted electronic apparatuses, 2: metal housing, 3: monitor unit, 4: first housing, 5: second housing, 6: upper surface cover, 7: rear surface cover, 10: screw fastening structure, 11: drawn portion, 12: bent portion, 13: first receiving surface, 14: second receiving surface, 15: screw receiving portion, 16: screw hole, 17: burring tap, 18: hole, 19: protrusion, 20: screw, 41, 43: side face, 42: bottom face, D: space inside housing, E: space outside housing

The invention claimed is:
1. A vehicle-mounted electronic apparatus comprising:
a screw fastening structure which fastens, to a first face of a metal housing, a second face, wherein
the screw fastening structure is provided with
a drawn portion having a shape protruded from the first face to an inside of the metal housing, the drawn portion provided at an end of the first face, the second face fastened to the end of the first face,
a bent portion having a shape bent toward a space outside the metal housing, the bent portion provided on a side of the drawn portion, the second face fastened to the side of the drawn portion, and
a screw receiving portion including a screw hole, the screw receiving portion formed of a first receiving surface, which is a flat surface portion on an end of the bent portion and is perpendicular to the first face, and a second receiving surface having a shape protruded from a base of the bent portion, the second receiving surface perpendicular to the first face.
2. The vehicle-mounted electronic apparatus according to claim 1, wherein
the screw fastening structure includes a protrusion provided on a portion of the drawn portion, the portion of the drawn portion opposed to the screw receiving portion, the protrusion abutting the screw receiving portion.

* * * * *